(12) United States Patent
Kidokoro

(10) Patent No.: US 11,555,850 B2
(45) Date of Patent: Jan. 17, 2023

(54) ERROR DETECTION DEVICE AND ERROR DETECTION METHOD

(71) Applicant: ANRITSU CORPORATION, Kanagawa (JP)

(72) Inventor: Hisao Kidokoro, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 17/510,730

(22) Filed: Oct. 26, 2021

(65) Prior Publication Data

US 2022/0236323 A1 Jul. 28, 2022

(30) Foreign Application Priority Data

Jan. 28, 2021 (JP) .............................. JP2021-012222

(51) Int. Cl.
*G01R 31/317* (2006.01)
*G01R 31/319* (2006.01)
(Continued)

(52) U.S. Cl.
CPC ....... *G01R 31/3171* (2013.01); *G01R 31/319* (2013.01); *G01R 31/3183* (2013.01); *H03M 13/35* (2013.01); *H04L 1/00* (2013.01)

(58) Field of Classification Search
CPC ............ G01R 31/3171; G01R 31/3183; G01R 31/319; H03M 13/35; H04L 1/00
See application file for complete search history.

(56) References Cited

U.S. PATENT DOCUMENTS 11,228,396 B2 * 1/2022 Doan ..................... H04L 1/0042
2019/0044764 A1 * 2/2019 Hollis ................... G11C 7/1084
(Continued)

FOREIGN PATENT DOCUMENTS

JP 2018-033098 A 3/2018

OTHER PUBLICATIONS

R. van der Linden, N. Tran, E. Tangdiongga and T. Koonen, "Optimization of Flexible Non-Uniform Multilevel PAM for Maximizing the Aggregated Capacity in PON Deployments," in Journal of Lightwave Technology, vol. 36, No. 12, pp. 2328-2336, 15 Jun. 15, 2018. (Year: 2018).*
(Continued)

*Primary Examiner* — Cynthia Britt
(74) *Attorney, Agent, or Firm* — Pearne & Gordon LLP (57) ABSTRACT

It is possible to know a guideline for adjusting the levels of three voltage thresholds of a PAM4 signal. An error detection device receives a measurement pattern including a pseudo random pattern having equal appearance frequencies of four levels, decodes the measurement pattern into a most significant bit sequence signal MSB and a least significant bit sequence signal LSB, based on three voltage thresholds Vth1, Vth2, and Vth3, identifies and counts, by a level counting unit, the four levels of the measurement pattern, based on the most significant bit sequence signal MSB and the least significant bit sequence signal LSB, and displays numerical values or bar graphs indicating ratios of the appearance frequencies of the four levels of the measurement pattern so as to be in the same order as waveform levels of the measurement pattern, based on a result of the counting.

4 Claims, 6 Drawing Sheets

(51) Int. Cl.
*G01R 31/3183* (2006.01)
*H04L 1/00* (2006.01)
*H03M 13/35* (2006.01)

(56) References Cited

U.S. PATENT DOCUMENTS

2019/0363917 A1* 11/2019 Iwai ..................... H04B 10/541
2020/0235828 A1* 7/2020 Kidokoro ................ H04L 27/04

OTHER PUBLICATIONS

Aurangozeb, M. Mohammad and M. Hossain, "Analog to Sequence Converter-Based PAM-4 Receiver With Built-In Error Correction," in IEEE Journal of Solid-State Circuits, vol. 53, No. 10, pp. 2864-2877, Oct. 2018. (Year: 2018).*

* cited by examiner

FIG.5A    FIG.5B    FIG.5C 1 and 2 are absent    1 is absent    Equal

FIG.5D    FIG.5E 3 is absent    0 and 3 are absent

ERROR DETECTION DEVICE AND ERROR DETECTION METHOD

TECHNICAL FIELD

The present invention relates to an error detection device and an error detection method which decode a measurement pattern consisting of a PAM4 signal by a Pulse Amplitude Modulation 4 scheme (PAM4 scheme), in which the amplitude is divided into four types for each symbol, into a binary signal (Non Return to Zero (NRZ) signal)), and detect an error of a PAM4 symbol based on the result of the decoded signal.

BACKGROUND ART

In 100G and 400G standards defined by IEEE, in order to respond to ultra-high speed of bit rate, transmission employing PAM4 signal is specified instead of transmission employing PAM2 (NRZ) signal in the related art.

For the PAM4 signal, for example, as shown in Patent Document 1 below, the most significant bit sequence signal (MSB) and the least significant bit sequence signal (LSB) are generated using two signal sources, and then these signals are added together to generate signals of four values of 0(00), 1(01), 2(10), and 3(11).

Figure 4:
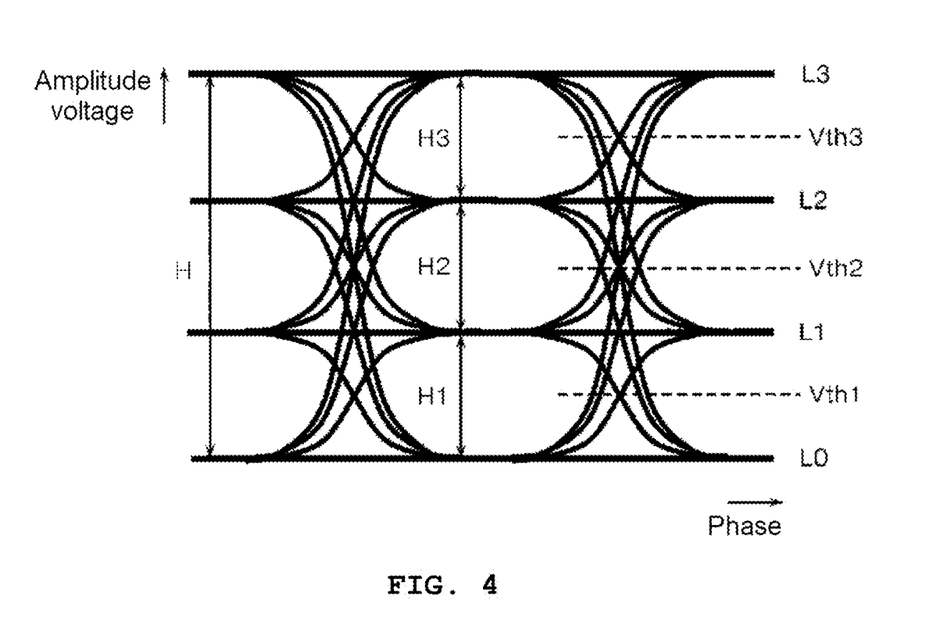
FIG. 4 is an explanatory diagram of a PAM4 signal.

To explain further, the amplitude of the PAM4 signal is divided into four types for each symbol, and as shown in FIG. 4, the PAM4 signal has four different amplitude voltages L0, L1, L2, and L3, and includes signals in an amplitude range in which the entire amplitude voltage range H is divided into a low voltage range H1, a medium voltage range H2, and a high voltage range H3, from a baseline (L0: 0 level), and three eye pattern openings formed by Upper signal (high level signal), Middle signal (medium level signal), and Lower signal (low level signal) having different amplitude levels with respect to the baseline (L0: 0 level) are continuous.

Incidentally, in order to receive this type of PAM signal, it is necessary to adjust the phase direction and adjust the three voltage thresholds Vth1, Vth2, and Vth3 for identifying the levels of the four values, and it is necessary to adjust a total of four parameters. Therefore, it is very difficult to properly match the three voltage thresholds Vth1, Vth2, and Vth3 as compared with the NRZ signal having one voltage threshold.

Here, the relationship between the PAM4 signal symbols and the three voltage thresholds Vth1, Vth2, and Vth3 is shown in FIGS. 5A to 5E.

Figure 5A:
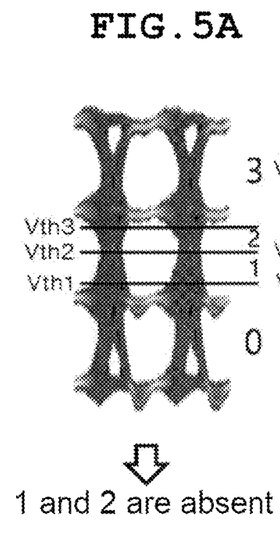
FIGS. 5A to 5E are diagrams showing relationships between symbols of the PAM4 signal and three voltage thresholds Vth1, Vth2, and Vth3.

FIG. 5A shows a case where the three voltage thresholds Vth1, Vth2, and Vth3 are set within the medium voltage range H2. In the case of FIG. 5A, the symbols of the PAM4 signal are decoded to be a combination of bits in which (MSB, LSB)=(1,0), (0,1) do not appear, and symbols 1 and 2 of the PAM4 signal are absent.

Figure 5B:
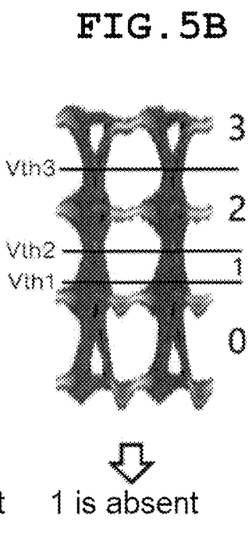

FIG. 5B shows a case where the voltage thresholds Vth1 and Vth2 are set within the medium voltage range H2 and the voltage threshold Vth3 is set within the high voltage range H3. In the case of FIG. 5B, the symbols of the PAM4 signal are decoded to be a combination of bits in which (MSB, LSB)=(0,1) does not appear, and the symbol 1 of the PAM4 signal is absent.

Figure 5C:
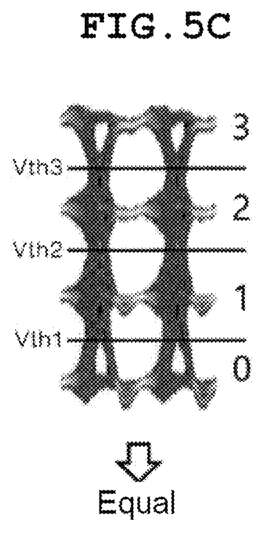

FIG. 5C shows a case where the voltage threshold Vth1 is set within the low voltage range H1, the voltage threshold Vth2 is set within the medium voltage range H2, and the voltage threshold Vth3 is set within the high voltage range H3. In the case of FIG. 5C, when the symbols of the PAM4 signal are decoded, the symbols 0, 1, 2, and 3 of the PAM4 signal become equal.

Figure 5D:
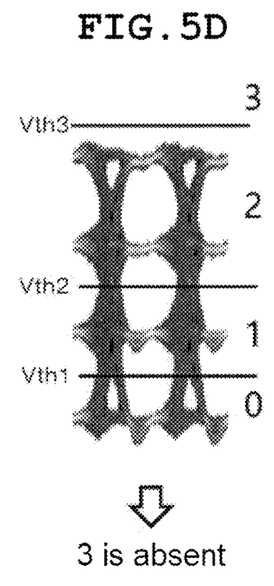

FIG. 5D shows a case where the voltage threshold Vth1 is set within the low voltage range H1, the voltage threshold Vth2 is set within the medium voltage range H2, and the voltage threshold Vth3 is set higher than the high voltage range H3. In the case of FIG. 5D, the symbols of the PAM4 signal are decoded to be a combination of bits in which (MSB, LSB)=(1,1) does not appear, and the symbol 3 of the PAM4 signal is absent.

Figure 5E:
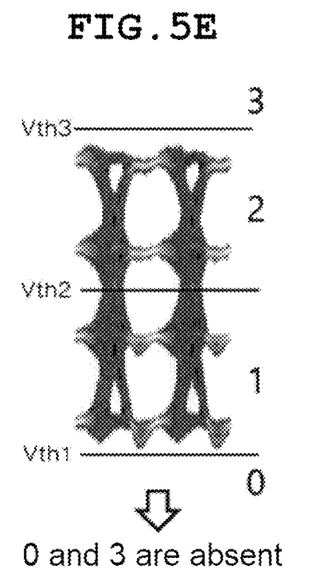

FIG. 5E shows a case where the voltage threshold Vth1 is set lower than the low voltage range H1, the voltage threshold Vth2 is set within the medium voltage range H2, and the voltage threshold Vth3 is set higher than the high voltage range H3. In the case of FIG. 5E, the symbols of the PAM4 signal are decoded to be a combination of bits in which (MSB, LSB)=(1,1), (0,0) do not appear, and symbols 0 and 3 of the PAM4 signal are absent.

RELATED ART DOCUMENT

[Patent Document]
[Patent Document 1] JP-A-2018-033098

DISCLOSURE OF THE INVENTION

Problem that the Invention is to Solve

A method is adopted in which the above-described three voltage thresholds Vth1, Vth2, and Vth3 are arranged to be error-free while bit error measurement is performed by using a pseudo random pattern such as Pseudo Random Bit Sequence (PRBS).

However, in the case of the PAM4 signal, even if error-free is obtained, the three voltage thresholds Vth1, Vth2, and Vth3 may not be correct values. For example, even if the voltage threshold Vth2 is set to the correct position in the medium voltage range H2, the bit string of the least significant bit sequence signal LSB to be decoded changes depending on the setting positions of the other two voltage thresholds Vth1 and Vth3.

Figure 6A:
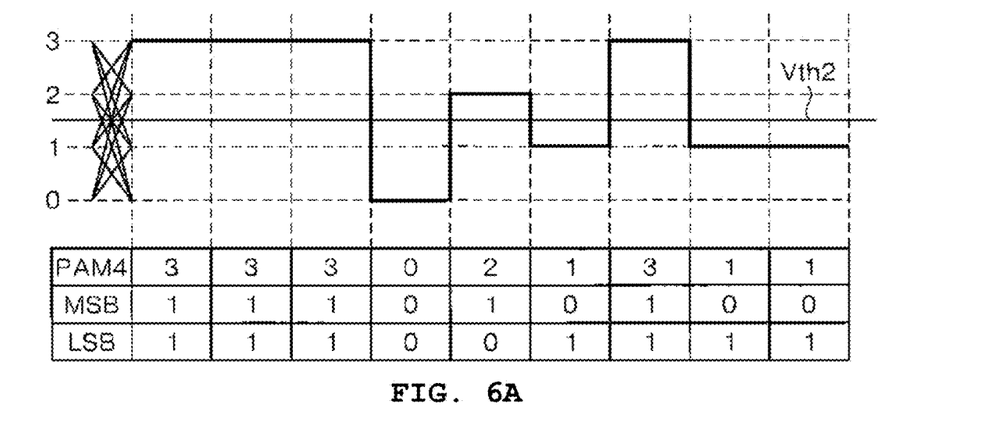
FIG. 6A shows an example of an input PAM4 signal.
Figure 6B:
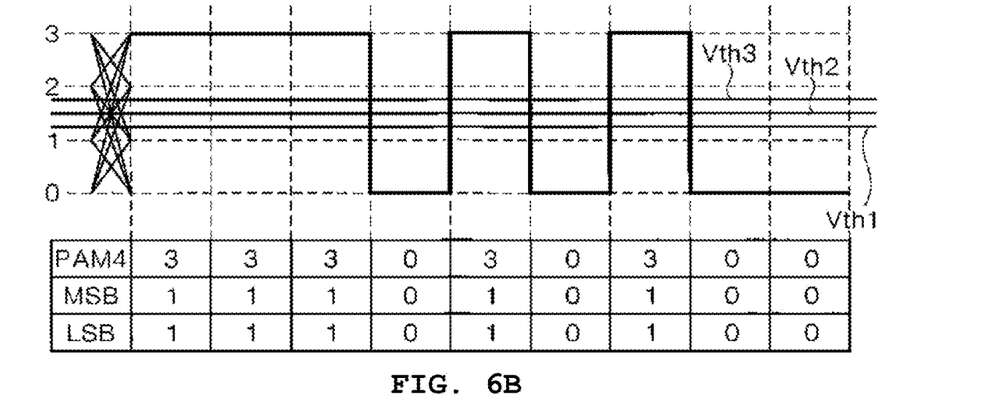
FIG. 6B is a diagram showing a result of a case where the PAM4 signal of FIG. 6A is decoded by setting the three voltage thresholds Vth1, Vth2, and Vth3 in a medium voltage range H2.

To explain further, as shown in FIG. 6A, for example, when the PAM4 signal whose symbols transition to 3, 3, 3, 0, 2, 1, 3, 1, 1 is used as the input signal, as shown in FIG. 6B, when three voltage thresholds Vth1, Vth2, and Vth3 are present between Level 2 and Level 1 of the PAM4 signal (within the medium voltage range H2), the bit string decoded into the least significant bit sequence signal LSB is 1, 1, 1, 0, 1, 0, 1, 0, 0, which is the same as the bit string of the most significant bit sequence signal MSB 1, 1, 1, 0, 1, 0, 1, 0, 0.

Then, in a pseudo random pattern such as PRBS, the least significant bit sequence signal LSB, which has the same bit string as the most significant bit sequence signal MSB, is in a state where there is no bit error. However, as shown in FIG. 5A, for the symbols of the PAM4 signal, there are no symbols of Level 1(0,1) and Level 2(1,0), and the PAM4 signal symbols are not in an error-free state. As a result, the symbols of the PAM4 signal cannot be received correctly.

Therefore, the present invention has been made in view of the above problems, and provides an error detection device and an error detection method capable of knowing a guideline for adjusting the levels of the three voltage thresholds of a PAM4 signal.

Means for Solving the Problem

In order to achieve the above object, an error detection device according to claim 1 of the present invention is an error detection device 1 including a decoding unit 4 that receives a measurement pattern including a pseudo random pattern having equal appearance frequencies of four levels from a device under test, and decodes the measurement pattern into a most significant bit sequence signal MSB and a least significant bit sequence signal LSB, based on three voltage thresholds Vth1, Vth2, and Vth3 for identifying voltages of the four levels of the measurement pattern, the error detection device including: a level counting unit 5 that identifies the four levels of the measurement pattern, based on the decoded most significant bit sequence signal and least significant bit sequence signal, and counts the number of each level; and a display unit 7 that displays at least one of numerical values or bar graphs indicating ratios of the appearance frequencies of the four levels of the measurement pattern, based on a result of counting by the level counting unit.

The error detection device according to claim 2 of the present invention is the error detection device according to claim 1, in which the numerical values or the bar graphs indicating the ratios of the appearance frequencies of the four levels of the measurement pattern are in the same order as waveform levels of the measurement pattern.

An error detection method according to claim 3 of the present invention is an error detection method that receives a measurement pattern including a pseudo random pattern having equal appearance frequencies of four levels from a device under test, decodes the measurement pattern into a most significant bit sequence signal MSB and a least significant bit sequence signal LSB, based on three voltage thresholds Vth1, Vth2, and Vth3 for identifying voltages of the four levels of the measurement pattern, the error detection method including: a step of, by the level counting unit 5 of the error detection device 1, identifying the four levels of the measurement pattern, based on the decoded most significant bit sequence signal and least significant bit sequence signal, and counting the number of each level; and a step of displaying at least one of numerical values or bar graphs indicating ratios of the appearance frequencies of the four levels of the measurement pattern, based on a result of the counting.

The error detection method according to claim 4 of the present invention is the error detection method according to claim 3, in which the numerical values or the bar graphs indicating the ratios of the appearance frequencies of the four levels of the measurement pattern are in the same order as waveform levels of the measurement pattern.

Advantage of the Invention

According to the present invention, the ratios of the appearance frequencies of the four levels of the PAM4 signal based on the three voltage thresholds set by the user can be checked as a numerical value or a bar graph on the display screen. In particular, if the ratio of the appearance frequencies of the four levels of the measurement pattern is displayed on the display screen as a bar graph, it is possible to visually check whether or not the four symbols of the PAM4 signal of the measurement pattern are generated evenly.

BEST MODE FOR CARRYING OUT THE INVENTION

Hereinafter, an embodiment for carrying out the present invention will be described in detail with reference to the attached drawings.

Figure 1:
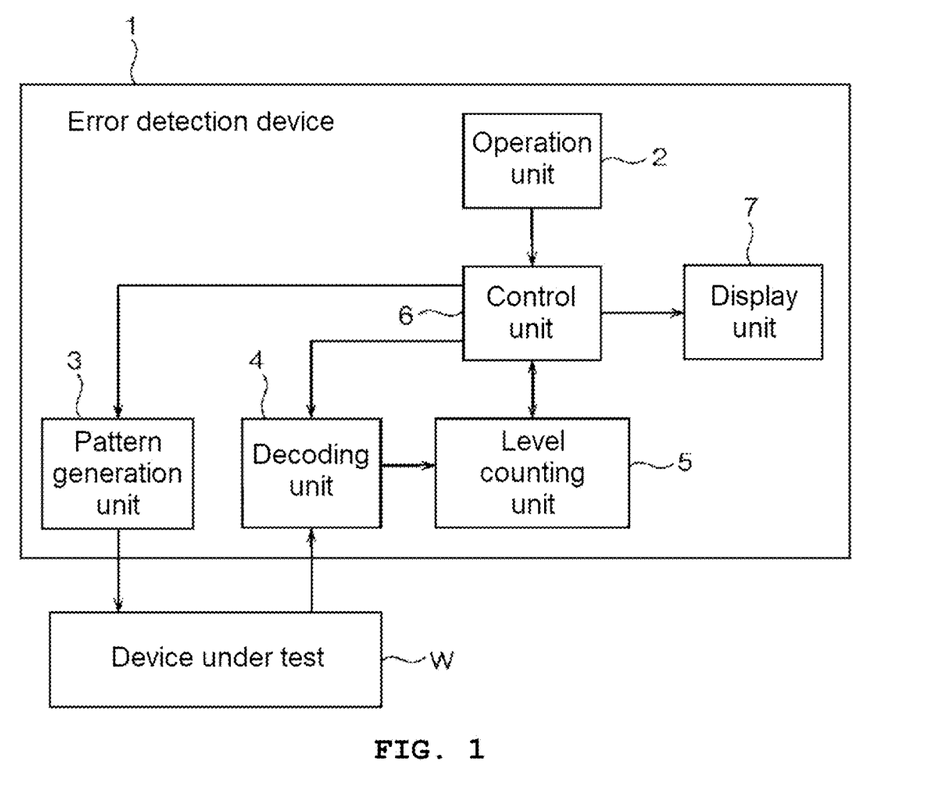
FIG. 1 is a block configuration diagram of an error detection device according to the present invention.

As shown in FIG. 1, an error detection device 1 receives a measurement pattern including a pseudo random pattern (PAM4 signal) in which appearance frequencies of four levels are equal, that is, PAM4 symbols 0, 1, 2, and are generated equally, three voltage thresholds Vth1, Vth2, and Vth3 for identifying voltages of four levels of the measurement pattern is set, identifies four levels (0 (Level 0), 1 (Level 1), 2 (Level 2), and 3 (Level 3) of the PAM4 symbol) of the measurement pattern, based on the three voltage thresholds Vth1, Vth2, and Vth3 to decode the measurement pattern into a binary signal (a most significant bit sequence signal MSB and a least significant bit sequence signal LSB), and detects an error in the PAM4 symbols, based on the result of the decoded binary signal, and is roughly configured with an operation unit 2, a pattern generation unit 3, a decoding unit 4, a level counting unit 5, a control unit 6, and a display unit 7.

The operation unit 2 includes, for example, a pointing device such as a mouse or a touch screen for operating a pointer or an icon on the display screen of the display unit 7, and keys, switches, buttons, or the like provided in the main body of the error detection device 1. The operation unit 2 performs various settings and operations related to the measurement, including instructions for starting and stopping the measurement of the device under test W, and setting of three voltage thresholds Vth1, Vth2, and Vth3 when receiving the PAM4 signal.

The pattern generation unit 3 generates a PAM4 signal of a pseudo random pattern (PRBS: Pseudo Random Bit Sequence) in which the appearance frequencies of the four levels of "0", "1", "2", and "3" are equal, as the measurement pattern input to the device under test W. Examples of the pseudo random pattern include bit sequence signals such as PRBS7 (pattern length: $2^7-1$), PRBS9 (pattern length: $2^9-1$), PRBS10 (pattern length: $2^{10}-1$), PRBS11 (pattern length: $2^{11}-1$), PRBS15 (pattern length: $2^{15}-1$), and PRBS20 (pattern length: $2^{20}-1$).

Although the error detection device 1 is configured to include the pattern generation unit 3 in FIG. 1, the pattern generation unit 3 can be configured independently of the error detection device 1.

The decoding unit 4 receives a measurement pattern (PAM4 signal), identifies voltages of four levels of the measurement pattern based on three preset voltage thresholds Vth1, Vth2, and Vth3, and decodes the measurement pattern into a most significant bit sequence signal (MSB) and a least significant bit sequence signal (LSB) which are binary signals (NRZ signals).

The level counting unit 5 identifies and counts the four levels of the measurement pattern, based on the most significant bit sequence signal (MSB) and the least significant bit sequence signal (LSB) decoded by the decoding unit 4, under the control of the control unit 6.

To explain further, the level counting unit 5 identifies four levels (MSB, LSB)=(0,0), (0,1), (1,0), and (1,1) of the measurement pattern from the most significant bit sequence signal MSB and the least significant bit sequence signal LSB decoded by the decoding unit 4, and counts each level. That is, (MSB, LSB)=(1,1) is counted as Level 3, (MSB, LSB)=(1,0) is counted as Level 2, (MSB, LSB)=(0,1) is counted as Level 1, and (MSB, LSB)=(0,0) is counted as Level 0.

The control unit 6 collectively controls each unit (the operation unit 2, the pattern generation unit 3, the decoding unit 4, the level counting unit 5, and the display unit 7) of the error detection device 1, and performs setting control of the voltage thresholds Vth1, Vth2, and Vth3 to the decoding unit 4 based on the operation of the operation unit 2, generation control of the measurement pattern from the pattern generation unit 3 to the device under test W, display control of the display unit 7 based on the count result of level counting unit 5, and the like.

Figure 3A:
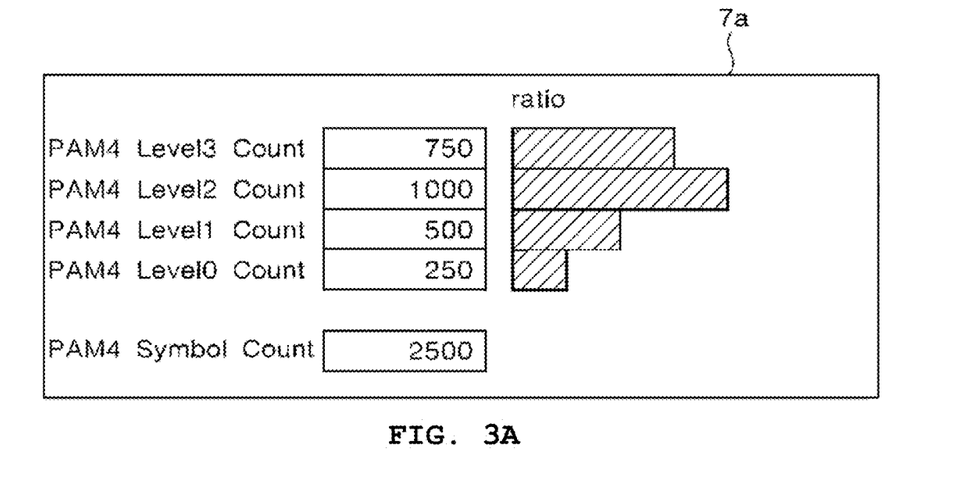
FIGS. 3A and 3B are diagrams showing a display example of a level count result of a PAM4 signal by the error detection device according to the present invention.
Figure 3B:
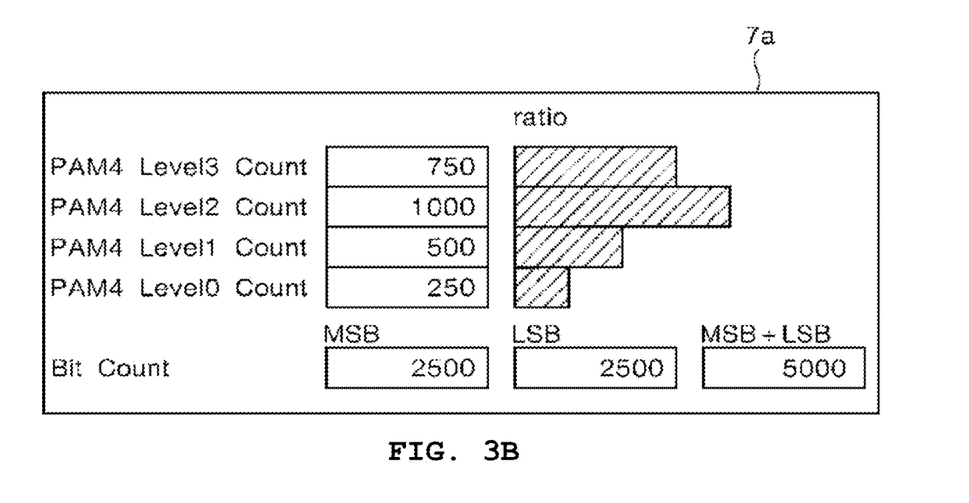

Under the control of the control unit 6, the display unit 7 displays the ratios of the appearance frequencies of the four levels of the measurement pattern such that the order is the same as the level of the waveform of the measurement pattern, based on the count result of the level counting unit 5, on the display screen 7a in the display format shown in FIGS. 3A and 3B, for example. The order of display is not limited to the same order as the level of the waveform of the measurement pattern, and may be, for example, any order specified by the user or an order opposite to the level of the waveform of the measurement pattern.

On the display screen 7a of FIG. 3A, the numerical values and the bar graphs (horizontal bar graphs) of the count results of Level 0, Level 1, Level 2, and Level 3 are displayed in parallel in order from the bottom of the baseline (L0: 0 level in FIG. 4) so as to be in the same order as the level of the waveform of the measurement pattern. Further, below these displays, a numerical value indicating the total value of the symbols of the measurement pattern counted by the level counting unit 5 is displayed. However, the order of display is not limited to the same order as the level of the waveform of the measurement pattern, and may be, for example, any order specified by the user or an order opposite to the level of the waveform of the measurement pattern.

The total value of the symbols of the measurement pattern (PAM4 Symbol Count) is calculated by PAM4 Level 3 Count+PAM4 Level 2 Count+PAM4 Level 1 Count+PAM4 Level 0 Count.

Similar to FIG. 3A, on the display screen 7a of FIG. 3B, the numerical values and the bar graphs (horizontal bar graphs) of the count results of Level 0, Level 1, Level 2, and Level 3 are displayed in parallel in order from the bottom of the baseline (L0: 0 level in FIG. 4) so as to be in the same order as the level of the waveform of the measurement pattern. Further, below these displays, the value obtained by converting the symbols of the measurement pattern counted by the level counting unit 5 into the bit count is displayed. However, the order of display is not limited to the same order as the level of the waveform of the measurement pattern, and may be, for example, any order specified by the user or an order opposite to the level of the waveform of the measurement pattern.

The bit count (MSB Bit Count) of the most significant bit sequence signal MSB is calculated by PAM4 Level 3 Count+PAM4 Level 2 Count+PAM4 Level 1 Count+PAM4 Level 0 Count, as a value obtained by converting the symbols of the measurement pattern into the bit count.

The bit count (LSB Bit Count) of the least significant bit sequence signal LSB is calculated by PAM4 Level 3 Count+PAM4 Level 2 Count+PAM4 Level 1 Count+PAM4 Level 0 Count.

Then, the total bit count (MSB+LSB Bit Count) of the most significant bit sequence signal MSB and the least significant bit sequence signal LSB is calculated by MSB Bit Count+LSB Bit Count.

incidentally, the error detection device 1 of FIG. 1 is configured such that the measurement pattern generated by the pattern generation unit 3 is input to the decoding unit 4 via the device under test W, but the present invention is not limited to this. For example, when the device under test W generates the above-described measurement pattern, the measurement pattern generated by the device under test W may be input to the decoding unit 4.

Figure 2:
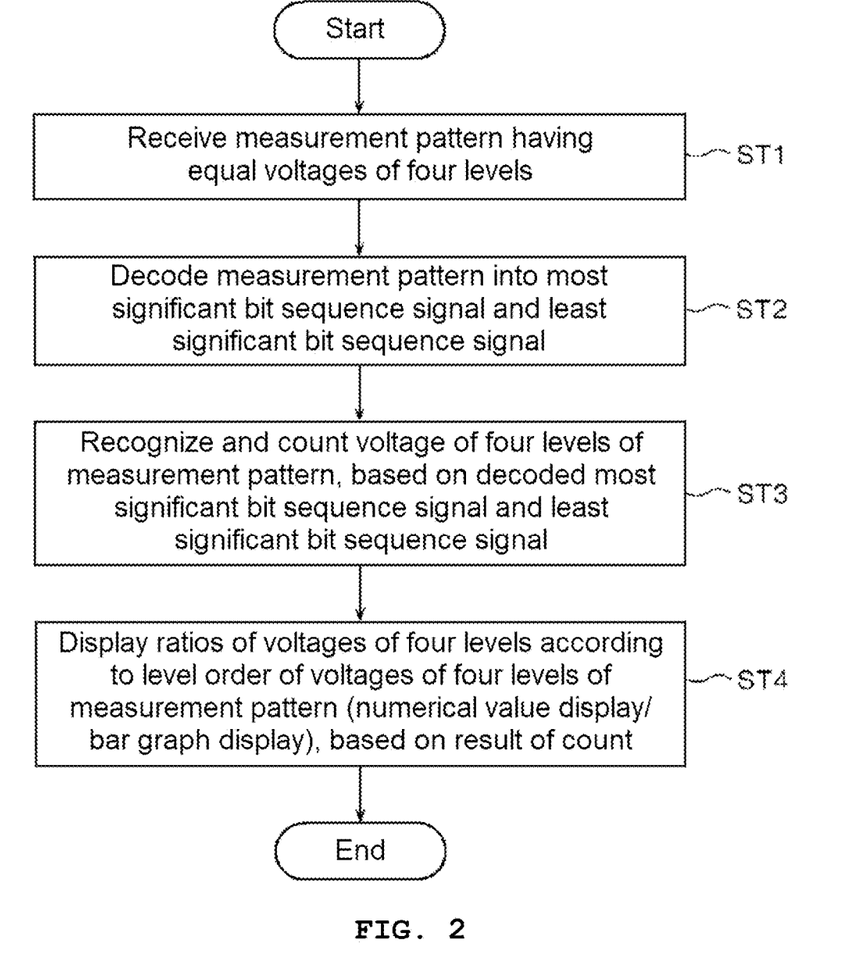
FIG. 2 is a flowchart of an error detection method according to the present invention.

Next, as an operation of the error detection device configured as described above, a display method for knowing a guideline for adjusting the levels of the three voltage thresholds Vth1, Vth2, and Vth3 of the measurement pattern will be described with reference to the flowchart of FIG. 2.

First, when a measurement pattern having equal appearance frequencies of four levels, generated by the pattern generation unit 3, under the control of the control unit 6 is input to the device under test W, the measurement pattern looped back from the device under test W is input to the decoding unit 4 (ST1).

In addition to the input of the measurement pattern that is generated by the pattern generation unit 3 and is looped back from the device under test (DUT), the measurement pattern can be transmitted and input by the device under test (DUT) itself having a transmission function.

Next, the decoding unit 4 compares the measurement pattern with the three voltage thresholds Vth1, Vth2, and Vth3 that are preset and controlled, and decodes the measurement pattern into the most significant bit sequence signal MSB and the least significant bit sequence signal LSB (ST2).

Subsequently, the level counting unit 5 recognizes and counts the four levels of the measurement pattern based on the most significant bit sequence signal MSB and the least significant bit sequence signal LSB decoded by the decoding unit 4 (ST3).

Then, under the display control by the control unit 6, the display unit 7 displays, based on a result of the count by the level counting unit 5, ratios of the appearance frequencies of the four levels according to the level order of the four levels of the measurement pattern, by numerical values or bar graphs (ST4). The order of display is not limited to the same order as the level of the waveform of the measurement pattern, and may be, for example, any order specified by the user or an order opposite to the level of the waveform of the measurement pattern.

As described above, according to the present embodiment, as shown in FIGS. 3A and 3B, the ratios of the appearance frequencies of four levels of the PAM4 signal based on the three voltage thresholds Vth1, Vth2, and Vth3 set by the user can be confirmed by numerical values or bar graphs on the display screen 7a of the display unit 7.

Then, in particular, when the ratios of the appearance frequencies of the four levels of the measurement pattern are displayed on the display screen 7a of the display unit 7 as a bar graph, it is possible to visually check whether or not the four symbols of the PAM4 signal of the measurement pattern are generated evenly. Further, when the display order is specified as the same as the waveform level of the measurement pattern, the display order matches the level order of the 4 levels of the measurement pattern, so that the ratios of the appearance frequencies of the four levels can be intuitively grasped from the numerical values or the bar graphs. In addition, when the display order is specified as any order specified by the user, the level of the measurement pattern that the user wants to focus on is in any position, so that the ratios of the appearance frequencies of the four levels can be easily grasped from the numerical values or the bar graphs. In addition, when the display order is specified as the reverse order of the waveform level of the measurement pattern, the levels are in positions in the reverse order of the measurement pattern according to the user's taste, so that the ratios of the appearance frequencies of the four levels can be easily grasped from the numerical values or the bar graphs.

When the measurement pattern including a pseudo random pattern such as PRBS is created such that four symbol types of a PAM4 signal are evenly generated, and error-free adjustment is performed using this pseudo random pattern, if the three voltage thresholds Vth1, Vth2, and Vth3 are adjusted in the display of FIGS. 3A and 3B such that the horizontal bar graphs showing the ratios of the appearance frequencies of the four levels of the PAM4 signal do not become uneven, the three voltage thresholds can be adjusted to voltage thresholds by which the four values of the symbols of the PAM4 signal are correctly distinguished. This makes it possible to correctly adjust the three voltage thresholds Vth1, Vth2, and Vth3 which cannot be correctly adjusted only by the bit error.

Further, since the high-speed PAM4 signal of 50 G or more has a small eye opening, the difference between the three voltage thresholds Vth1, Vth2, and Vth3 is only several tens of mV, and it is very difficult to adjust the voltage thresholds Vth1, Vth2, and Vth3.

However, according to the present embodiment, it is possible to obtain a guideline for adjusting the levels of the three voltage thresholds Vth1, Vth2, and Vth3 by the display of FIGS. 3A and 3B. This makes it possible to easily adjust the reception of the symbols of the measurement pattern (PAM4 signal). Then, when the appearance frequency of each level of the PAM4 signal is equal, it indicates that the three voltage thresholds Vth1, Vth2, and Vth3 are correct values, so that error-free of the symbols of the PAM4 signal can be achieved by adjusting the phase direction.

Although the best form of the error detection device and the error detection method according to the present invention has been described above, the present invention is not limited by the description and drawings in this form. That is, it goes without saying that all other forms, examples, operational techniques, and the like made by those skilled in the art based on this form are included in the scope of the present invention.

DESCRIPTION OF REFERENCE NUMERALS AND SIGNS

1 Error detection device
60 Operation unit
3 Pattern generation unit
4 Decoding unit
5 Level counting unit
6 Control unit
7 Display unit
7a Display screen
W Device under test (DUT)

What is claimed is:

1. An error detection device comprising:
    a receiver configured to receive a measurement pattern including a pseudo random pattern having equal appearance frequencies of four levels from a device under test, and configured to decode the measurement pattern into a most significant bit sequence signal and a least significant bit sequence signal, based on three voltage thresholds for identifying voltages of the four levels of the measurement pattern;
    a processor configured to identify the four levels of the measurement pattern, based on the decoded most significant bit sequence signal and least significant bit sequence signal, and configured to count the number of each level; and
    a display configured to display at least one of numerical values or bar graphs indicating ratios of the appearance frequencies of the four levels of the measurement pattern, based on a result of counting by the processor.

2. The error detection device according to claim 1, wherein the numerical values or the bar graphs indicating the ratios of the appearance frequencies of the four levels of the measurement pattern are in the same order as waveform levels of the measurement pattern.

3. An error detection method comprising:
    receiving a measurement pattern including a pseudo random pattern having equal appearance frequencies of four levels from a device under test, and decoding the measurement pattern into a most significant bit sequence signal and a least significant bit sequence signal, based on three voltage thresholds for identifying voltages of the four levels of the measurement pattern;
    by a processor of an error detection device, identifying the four levels of the measurement pattern, based on the decoded most significant bit sequence signal and least significant bit sequence signal, and counting the number of each level; and
    displaying at least one of numerical values or bar graphs indicating ratios of the appearance frequencies of the four levels of the measurement pattern, based on a result of the counting.

4. The error detection method according to claim 3, wherein the numerical values or the bar graphs indicating the ratios of the appearance frequencies of the four levels of the measurement pattern are in the same order as waveform levels of the measurement pattern.

* * * * *